(12) United States Patent
Lee et al.

(10) Patent No.: US 12,696,523 B2
(45) Date of Patent: Jul. 28, 2026

(54) METHOD OF MANUFACTURING SEMICONDUCTOR DEVICE

(71) Applicant: Samsung Electronics Co., Ltd., Suwon-si (KR)

(72) Inventors: Jangeun Lee, Hwaseong-si (KR); Hyojung Noh, Cheonan-si (KR); Minwoo Song, Seongnam-si (KR); Yongho Ha, Hwaseong-si (KR); Jeongwon Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 728 days.

(21) Appl. No.: 17/950,512

(22) Filed: Sep. 22, 2022

(65) Prior Publication Data

US 2023/0178439 A1     Jun. 8, 2023

(30) Foreign Application Priority Data

Dec. 7, 2021     (KR) ......................... 10-2021-0174017

(51) Int. Cl.
H10B 12/00          (2023.01)
H10D 62/10          (2025.01)
(Continued)

(52) U.S. Cl.
CPC ......... H10D 84/038 (2025.01); H10B 12/053 (2023.02); H10B 12/34 (2023.02);
(Continued)

(58) Field of Classification Search
CPC .............. H10D 84/038; H10D 62/107; H10D 84/0144; H10D 84/0156; H10D 64/027;
(Continued)

(56) References Cited

U.S. PATENT DOCUMENTS 6,653,212 B1 * 11/2003 Yamanaka .......... C23C 16/0236
                                                             118/724
8,278,201 B2   10/2012 Jang
(Continued)

FOREIGN PATENT DOCUMENTS

KR     10-2020-0144179 A     12/2020
TW           I495037 B       8/2015

OTHER PUBLICATIONS

Takashi Matsukawa, et al., Dual-Metal-Gate Transistors with Symmetrical Threshold Voltages Using Work-Function-Tuned Ta/Mo Bilayer Metal Gates, 2008, Japanese Journal of Applied Physics, vol. 47, No. 4, pp. 2428-2432 (Year: 2008) (Year: 2008).*
(Continued)

*Primary Examiner* — William B Partridge
*Assistant Examiner* — Erik A. Anderson
(74) *Attorney, Agent, or Firm* — Fish & Richardson P.C.

(57)          ABSTRACT

A method of manufacturing a semiconductor device is provided. The method of manufacturing a semiconductor device includes an forming a trench in a substrate, forming a gate dielectric layer on the trench, forming a gate layer on the gate dielectric layer, and annealing the gate dielectric layer and the gate layer, wherein, after the first annealing operation, the gate layer includes a molybdenum-tantalum alloy.

19 Claims, 18 Drawing Sheets

SD

(51) Int. Cl.
　　H10D 84/01 　　　　(2026.01)
　　H10D 84/03 　　　　(2025.01)

(52) U.S. Cl.
　　CPC ....... H10D 62/107 (2025.01); H10D 84/0144
　　　　　　(2025.01); H10D 84/0156 (2025.01)

(58) Field of Classification Search
　　CPC .... H10D 64/691; H10D 30/60; H10D 64/513;
　　　　　　H10D 64/661; H10D 64/666; H10D
　　　　　　64/667; H10D 64/671; H10D 64/01;
　　　　　　H10D 30/023; H10D 30/611; H10D
　　　　　　30/025; H10D 64/01316; H10B 12/053;
　　　　　　H10B 12/34; H01L 21/28079
　　See application file for complete search history.

(56)　　　　　　References Cited

U.S. PATENT DOCUMENTS

| | | | |
|---|---|---|---|
| 8,669,611 | B2 | 3/2014 | Ng et al. |
| 9,178,039 | B2 | 11/2015 | Park et al. |
| 9,553,167 | B2 | 1/2017 | Jang |
| 9,780,220 | B2 | 10/2017 | Maeda et al. |
| 10,937,701 | B2 | 3/2021 | Chang et al. |
| 11,004,854 | B2 | 5/2021 | Nam |
| 11,075,272 | B2 | 7/2021 | Kim |
| 2005/0263835 | A1* | 12/2005 | Sakama ............. H10D 30/0321<br>257/E21.414 |
| 2010/0019249 | A1* | 1/2010 | Mouli ................... H10D 62/82<br>257/280 |
| 2011/0175176 | A1* | 7/2011 | Frank ................ H01L 21/28247<br>219/393 |
| 2015/0194438 | A1* | 7/2015 | Kim ..................... H10B 12/488<br>257/324 |
| 2016/0107885 | A1* | 4/2016 | Schalberger ...... H01L 21/30604<br>438/155 |
| 2017/0365679 | A1* | 12/2017 | None ................ H01L 21/76846 |
| 2018/0342425 | A1* | 11/2018 | Chang ................. H10B 12/488 |
| 2020/0135915 | A1* | 4/2020 | Savant ................ H10D 30/024 |
| 2020/0243374 | A1* | 7/2020 | Choi ................... H01L 21/3212 |
| 2020/0294865 | A1* | 9/2020 | Cheng ................. H10D 62/822 |
| 2021/0391252 | A1* | 12/2021 | Liang ................ H01L 21/76805 |
| 2022/0285496 | A1* | 9/2022 | Chen ................... H10D 30/751 |

OTHER PUBLICATIONS

Jenny Hu et al., Effect of Annealing Ambient and Temperature on the Electrical Characteristics of Atomic Layer Deposition Al2O3/In0.53Ga0.47As Metal-Oxide-Semiconductor Capacitors and MOSFETs, Feb. 28, 2012, 111, pp. 044105-1 through 044105-8 (Year: 2012).*

Matsukawa, Takashi et al., 'Dual-Metal-Gate Transistors with Symmetrical Threshold Voltages Using Work-Function-Tuned Ta/Mo Bilayer Metal Gates', *Japanese Journal of Applied Physics*, vol. 47, No. 4, 2008, pp. 2428-2432.

Taiwanese Office Action issued Sep. 26, 2023, for corresponding Taiwanese Patent Application No. 111137752.

Office Action in Korean Appln. No. 10-2021-0174017, mailed on Aug. 8, 2025, 7 pages (with English translation).

* cited by examiner

METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2021-0174017, filed on Dec. 7, 2021, in the Korean Intellectual Property Office, the disclosure of which is incorporated by reference herein in its entirety.

BACKGROUND

Inventive concepts relate to a method of manufacturing a semiconductor device. For example, inventive concepts relate to a method of manufacturing a buried channel array transistor (BCAT).

Buried channel array transistors (BCATs) include a gate structure recessed into a substrate. There is a trend where a dimension of a gate structure is reduced for enhancing the degree of integration of semiconductor devices. When a dimension of a gate structure is reduced, a resistance of a gate layer may increase. Therefore, it is required or desired to develop a new material for a gate layer, so as to the degree of integration of semiconductor devices.

SUMMARY

Inventive concepts provide a semiconductor device in which the degree of integration is enhanced, and/or a method of fabricating the same.

According to some example embodiments, there is provided a method of manufacturing a semiconductor device, the method including forming a trench in a substrate, forming a gate dielectric layer on or in the trench, forming a gate layer on the gate dielectric layer, and of annealing the gate dielectric layer and the gate layer. After the first annealing operation, the gate layer includes a molybdenum-tantalum alloy.

According to some example embodiments, there is provided a method of manufacturing a semiconductor device, the method including forming a trench in a substrate, forming a gate dielectric layer on or in the trench, forming a gate layer on the gate dielectric layer, and annealing the gate dielectric layer and the gate layer. The operation of forming the gate layer includes forming a first tantalum layer on the gate dielectric layer and forming a first molybdenum layer on the first tantalum layer.

According to some example embodiments, there is provided a method of manufacturing a semiconductor device, the method including forming a trench on or in a substrate, forming a gate dielectric layer on the trench, forming a gate layer on the gate dielectric layer, and annealing the gate dielectric layer and the gate layer, wherein the forming the gate layer further includes forming a first molybdenum layer on the gate dielectric layer and forming a first tantalum layer on the first molybdenum layer.

BRIEF DESCRIPTION OF THE DRAWINGS

Embodiments of inventive concepts will be more clearly understood from the following detailed description taken in conjunction with the accompanying drawings in which.

DETAILED DESCRIPTION OF VARIOUS EXAMPLE EMBODIMENTS

Figure 1:
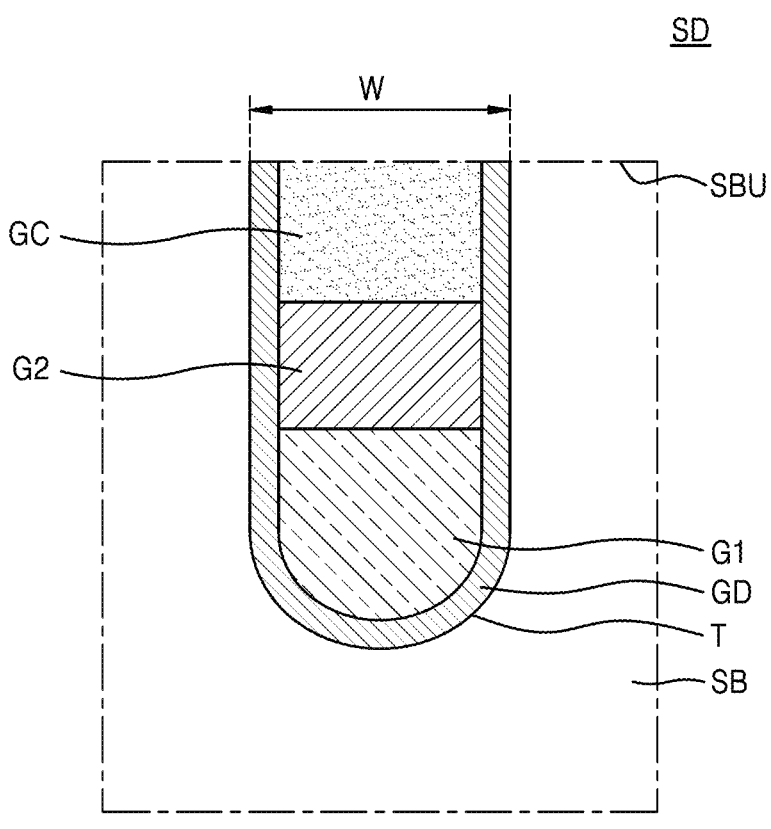
FIG. 1 is a cross-sectional view of a semiconductor device according to some example embodiments.
Figure 2:
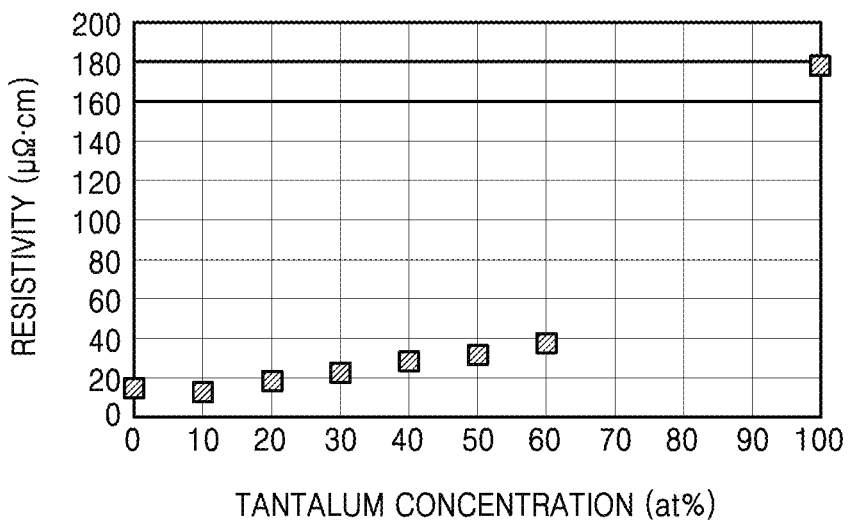
FIG. 2 is a graph showing a resistivity of a molybdenum-tantalum alloy with respect to a tantalum concentration.
Figure 3:
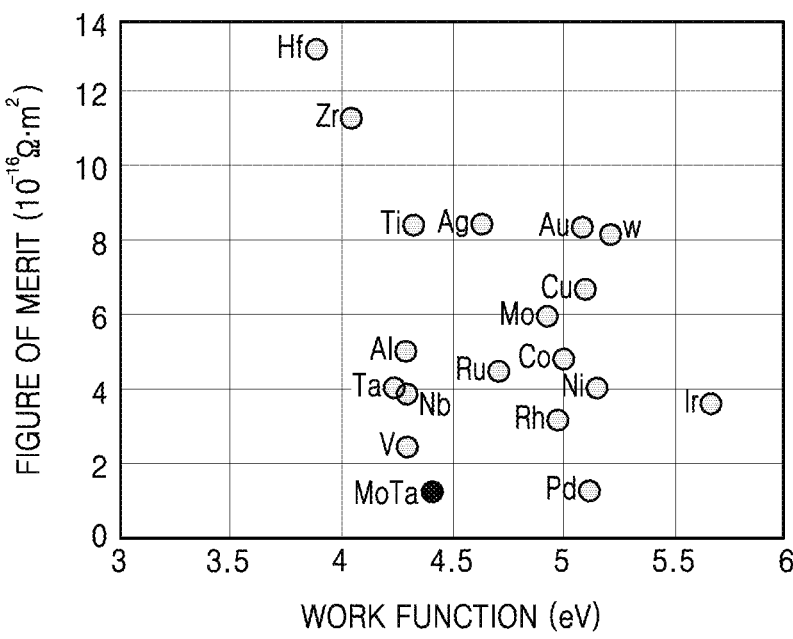
FIG. 3 is a graph showing a work function and a figure of merit of each of various materials.

FIG. 1 is a cross-sectional view of a semiconductor device SD according to some example embodiments. FIG. 2 is a graph showing a resistivity of a molybdenum-tantalum alloy with respect to a tantalum concentration. FIG. 3 is a graph showing a work function and a figure of merit of each of various materials.

Referring to FIGS. 1 to 3, the semiconductor device SD may include a substrate SB, a gate dielectric layer GD on a trench T of the substrate SB, and a first gate layer G1 on the gate dielectric layer GD. In some example embodiments, the semiconductor device SD may further include a second gate layer G2 on the first gate layer G1. The semiconductor device SD may further include a gate capping layer GC on the second gate layer G2.

The substrate SB may include a semiconductor material such as one or more of a group IV semiconductor material, a group III-V semiconductor material, or a group II-VI semiconductor material. The group IV semiconductor material may include, for example, one or more of silicon (Si), germanium (Ge), or silicon-germanium (Si—Ge). The group III-V semiconductor material may include, for example, gallium arsenic (GaAs), indium phosphorous (InP), gallium phosphorous (GaP), indium arsenic (InAs), indium antimony (InSb), or indium gallium arsenic (In-GaAs). The group II-VI II-VI semiconductor material may include, for example, zinc telluride (ZnTe) or cadmium sulfide (CdS). The substrate SB may be doped, e.g. may be lightly doped with P-type material such as boron and/or with N-type material such as at least one of arsenic or phosphorus; however, example embodiments are not limited thereto.

The substrate S may include or define the trench T. The trench T of the substrate SB may be recessed into the substrate SB from a top surface SBU of the substrate SB. A width W of the trench T may be about 2 nm to about 20 nm (for example, about 2 nm to about 15 nm or about 2 nm to about 10 nm); however, example embodiments are not limited thereto.

The gate dielectric layer GD may be disposed on or in or conformal with the trench T of the substrate SB. The gate dielectric layer GD may include silicon oxide, silicon nitride, silicon oxynitride, a high-k material, or a combination thereof. The high-k material may include, for example, aluminum oxide ($Al_2O_3$), hafnium oxide ($HfO_2$), yttrium oxide ($Y_2O_3$), zirconium oxide ($ZrO_2$), titanium oxide ($TiO_2$), or a combination thereof.

The first gate layer G1 may be disposed on the gate dielectric layer GD. In some example embodiments, an upper end of the first gate layer G1 may be disposed at a level which is lower than the top surface SBU of the substrate SB. The first gate layer G1 may fill a lower portion of the trench T. In some example embodiments, the first gate layer G1 may include a molybdenum-tantalum (Mo—Ta) alloy. Although the upper end of the first gate layer G1 is illustrated as being planar and parallel with the top surface SBU of the substrate SB, example embodiments are not limited thereto.

As illustrated in FIG. 2, a resistivity of a Mo—Ta alloy may increase within a range of about 20 μΩ·cm (microohm-centimeter) to about 180 μΩ·cm as a tantalum (Ta) concentration increases. When a Ta concentration is about 5 at % to about 50 at %, a resistivity of a Mo—Ta alloy may be about 30 μΩ·cm or less.

The following Table 1 may show a resistivity, an electron mean free path, and a figure of merit of each of various materials. The figure of merit of a material may be defined as the multiplication of a resistivity of a material and an electron mean free path of the material. It may be preferable that a resistance of the first gate layer G1 is reduced, and thus, it may be preferable that a material of the first gate layer G1 is reduced in resistivity. Alternatively or additionally, as an electron mean free path of a material is reduced, an increase in resistance of the first gate layer G1 caused by a reduction in width W of the trench T may decrease, and thus, it may be preferable that an electron mean free path of a material of the first gate layer G1 is reduced. Therefore, it may be preferable that a figure of merit corresponding to the multiplication of a resistivity of a material and an electron mean free path of the material is reduced. As listed in Table 1, a Mo—Ta alloy among various materials may has a highest figure of merit. Alternatively or additionally, an electron mean free path of a Mo—Ta alloy may be less than the width W of the trench T, and thus, an increase in resistance of the first gate layer G1 caused by a reduction in width W of the trench T may decrease.

TABLE 1

| Material | Resistivity (μΩ · cm) | Electron mean free path (nm) | Figure of merit ($10^{-16}\Omega \cdot m^2$) |
|---|---|---|---|
| Cu | 1.7 | 39.9 | 6.7 |
| W | 5.3 | 15.5 | 8.2 |
| TiN | 13 | 45 | 58.5 |
| Mo | 5.3 | 11.2 | 6 |
| Ru | 7.8 | 6.6 | 4.5 |
| Ir | 4.7 | 7.1 | 3.7 |

4

TABLE 1-continued

| Material | Resistivity (μΩ · cm) | Electron mean free path (nm) | Figure of merit ($10^{-16}\Omega \cdot m^2$) |
|---|---|---|---|
| Rh | 4.3 | 6.9 | 3.2 |
| MoTa | 30 | 0.4 | 1.2 |

As illustrated in FIG. 3, a Mo—Ta alloy may have a relatively low work function. A work function of a Mo—Ta alloy may be about 4.5 eV. Additionally, Ta of a Mo—Ta alloy may induce a positive fixed charge of the gate dielectric layer GD through an interface reaction with the gate dielectric layer GD. Therefore, an effective work function of a Mo—Ta alloy may be lower than a value shown in FIG. 3. A low effective work function may enhance an electrical characteristic of the semiconductor device SD, such as by reducing power and/or by increasing frequency of operation. To provide a summary description, a Mo—Ta alloy may be used as a material of the first gate layer G1, on the basis of the figure of merit and the work function.

The second gate layer G2 may be disposed on the first gate layer G1, and may contact the gate dielectric layer GD. An upper end of the second gate layer G2 may be disposed at a level which is lower than the top surface SBU of the substrate SB. The second gate layer G2 may fill a center portion of the trench T. In some example embodiments, the second gate layer G2 may be omitted. In some example embodiments, the second gate layer G2 may include a material having a work function which is lower than that of the first gate layer G1. The second gate layer G2 may include, for example, polysilicon (e.g. doped polysilicon). Although the second gate layer G2 is illustrated as having a planar upper surface, example embodiments are not limited thereto.

The gate capping layer GC may be disposed on the second gate layer G2. In some example embodiments where the second gate layer G2 is omitted, the gate capping layer GC may be disposed on the first gate layer G1. In some example embodiments, a top surface of the gate capping layer GC may be coplanar with the top surface SBU of the substrate SB. The gate capping layer GC may contact the gate dielectric layer GD, e.g. on sidewalls thereof. The gate capping layer GC may fill an upper portion of the trench T. The gate capping layer GC may include silicon oxide, silicon nitride, or a combination thereof.

Figure 4:
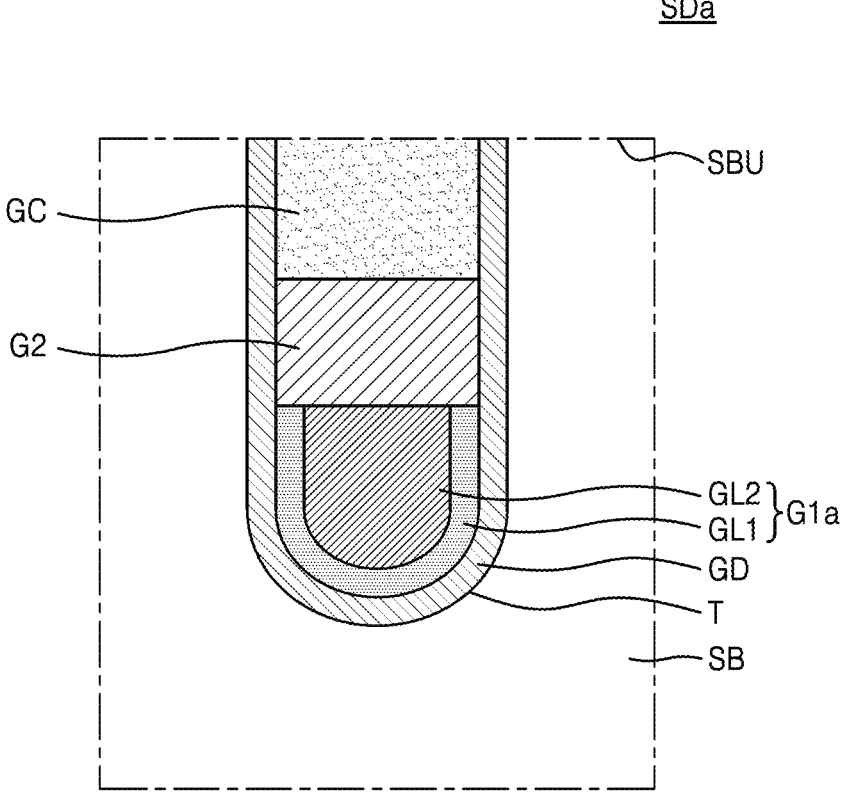
FIG. 4 is a cross-sectional view of a semiconductor device according to some example embodiments.

FIG. 4 is a cross-sectional view of a semiconductor device SDa according to some example embodiments. Hereinafter, a difference between the semiconductor device SD illustrated in FIG. 1 and the semiconductor device SDa illustrated in FIG. 4 will be described.

Referring to FIG. 4, the semiconductor device SDa may include a substrate SB, a gate dielectric layer GD on a trench T of the substrate SB, and a first gate layer G1a on the gate dielectric layer GD. In some example embodiments, the semiconductor device SDa may further include a second gate layer G2 on the first gate layer G1a. The semiconductor device SDa may further include a gate capping layer GC on the second gate layer G2. Detailed descriptions of the substrate SB, the gate dielectric layer GD, the second gate layer G2, and the gate capping layer GC are the same as the descriptions of FIG. 1.

The first gate layer G1a may include a tantalum layer GL1 on the gate dielectric layer GD (e.g. conformal with the gate dielectric layer GD) and a molybdenum layer GL2 on the tantalum layer GL1. In some example embodiments, an upper end of the tantalum layer GL1 may be disposed at the same level as an upper end of the molybdenum layer GL2. The second gate layer G2 may be disposed on the tantalum layer GL1 and the molybdenum layer GL2. In some example embodiments, although not shown in FIG. 4, the first gate layer G1a may further include a Mo—Ta alloy between the molybdenum layer GL2 and the tantalum layer GL1. In some example embodiments, the tantalum layer GL1 and the molybdenum layer GL2 may be partially mixed and/or homogenized. Ta of the tantalum layer GL1 may induce a positive fixed charge of the gate dielectric layer GD through an interface reaction with the gate dielectric layer GD, and thus, an effective work function of the first gate layer G1a may be reduced. When the tantalum layer GL1 directly contacts the gate dielectric layer GD, a probability that the interface reaction occurs may increase.

Figure 5:
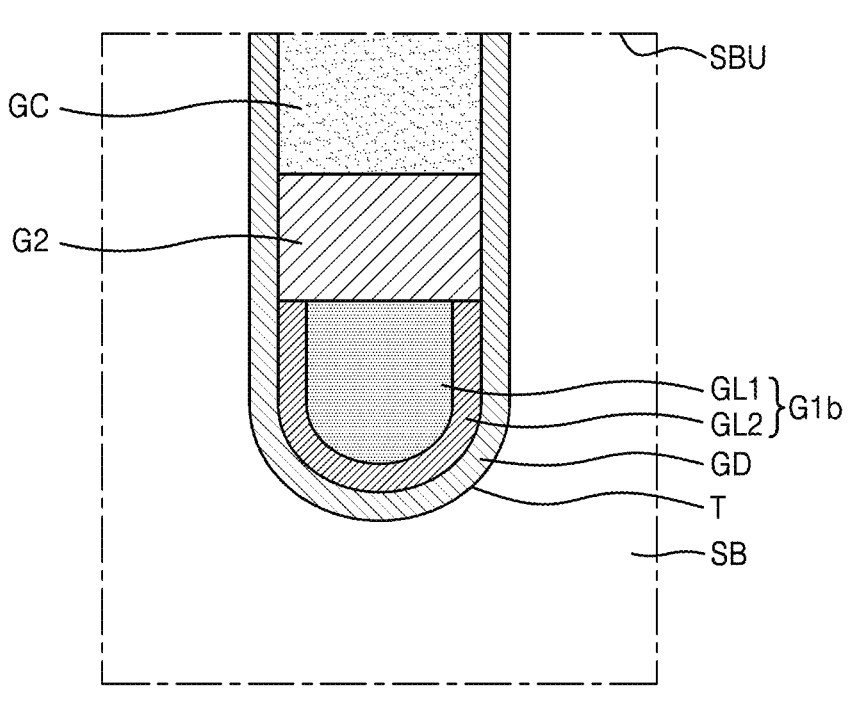
FIG. 5 is a cross-sectional view of a semiconductor device according to some example embodiments.

FIG. 5 is a cross-sectional view of a semiconductor device SDb according to some example embodiments. Hereinafter, a difference between the semiconductor device SD illustrated in FIG. 1 and the semiconductor device SDb illustrated in FIG. 5 will be described.

Referring to FIG. 5, the semiconductor device SDb may include a substrate SB, a gate dielectric layer GD on a trench T of the substrate SB, and a first gate layer G1b on the gate dielectric layer GD. In some example embodiments, the semiconductor device SDb may further include a second gate layer G2 on the first gate layer G1b. The semiconductor device SDb may further include a gate capping layer GC on the second gate layer G2. Detailed descriptions of the substrate SB, the gate dielectric layer GD, the second gate layer G2, and the gate capping layer GC are the same as the descriptions of FIG. 1.

The first gate layer G1b may include a molybdenum layer GL2 on the gate dielectric layer GD and a tantalum layer GL1 on the molybdenum layer GL2. In some example embodiments, an upper end of the tantalum layer GL1 may be disposed at the same level as an upper end of the molybdenum layer GL2. The second gate layer G2 may be disposed on the tantalum layer GL1 and the molybdenum layer GL2. In some example embodiments, although not shown in FIG. 5, the first gate layer G1a may further include a Mo—Ta alloy between the molybdenum layer GL2 and the tantalum layer GL1. In some example embodiments, the tantalum layer GL1 and the molybdenum layer GL2 may be partially mixed or partially homogenized. The molybdenum layer GL2 may protect the gate dielectric layer GD to prevent or decrease the likelihood of and/or impact from an increase in trap density of the gate dielectric layer GD.

Figure 6:
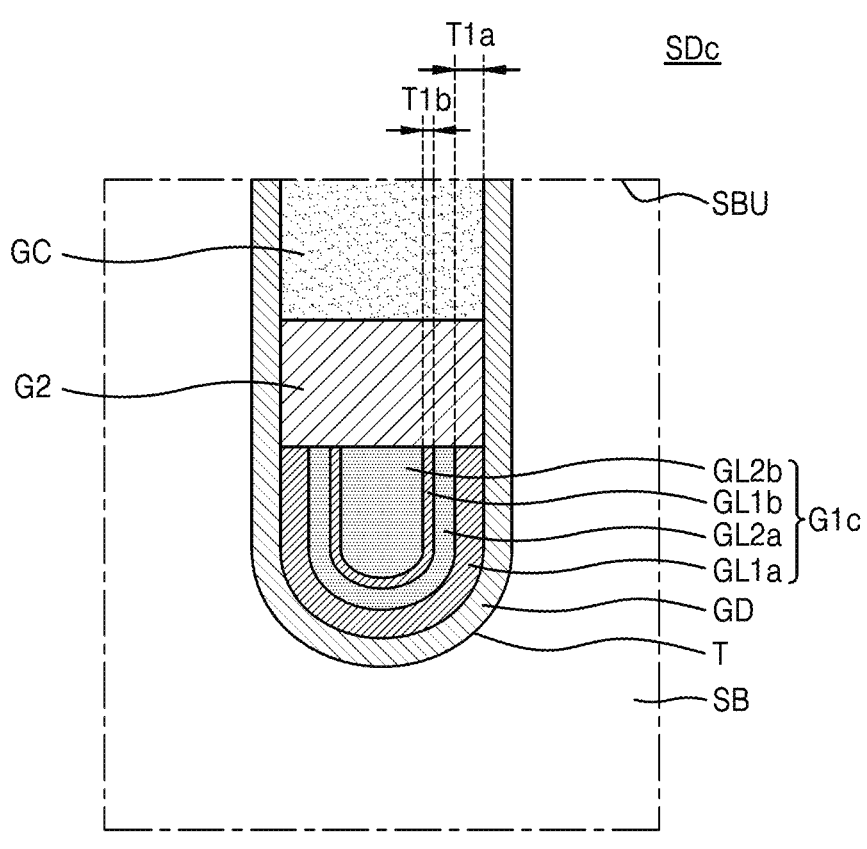
FIG. 6 is a cross-sectional view of a semiconductor device according to some example embodiments.

FIG. 6 is a cross-sectional view of a semiconductor device SDc according to some example embodiments. Hereinafter, a difference between the semiconductor device SD illustrated in FIG. 1 and the semiconductor device SDc illustrated in FIG. 6 will be described.

Referring to FIG. 6, the semiconductor device SDc may include a substrate SB, a gate dielectric layer GD on a trench T of the substrate SB, and a first gate layer G1c on the gate dielectric layer GD. In some example embodiments, the semiconductor device SDc may further include a second gate layer G2 on the first gate layer G1c. The semiconductor device SDc may further include a gate capping layer GC on the second gate layer G2. Detailed descriptions of the substrate SB, the gate dielectric layer GD, the second gate layer G2, and the gate capping layer GC are the same as the descriptions of FIG. 1.

The first gate layer G1c may include a plurality of tantalum layers and a plurality of molybdenum layers, which are alternately arranged on the gate dielectric layer GD one by one. For example, the first gate layer G1c may have a Ta—Mo multilayer structure. For example, the first gate layer G1c may include a first tantalum layer GL1a on the gate dielectric layer GD, a first molybdenum layer GL2a on the first tantalum layer GL1a, a second tantalum layer GL1b on the first molybdenum layer GL2a, and a second molybdenum layer GL2b on the second tantalum layer GL1b. In FIG. 6, the first gate layer G1c is illustrated as including two tantalum layers and two molybdenum layers, but the number of tantalum layers and the number of molybdenum layers included in the first gate layer G1c are not limited to 2 and may be variously changed.

In some example embodiments, an upper end of the first tantalum layer GL1a, an upper end of the first molybdenum layer GL2a, an upper end of the second tantalum layer GL1b, and an upper end of the second molybdenum layer GL2b may be disposed at the same level. The second gate layer G2 may be disposed on the first tantalum layer GL1a, the first molybdenum layer GL2a, the second tantalum layer GL1b, and the second molybdenum layer GL2b.

In some example embodiments, although not shown in FIG. 6, the first gate layer G1c may further include at least one of a first Mo—Ta alloy layer between the first tantalum layer GL1a and the first molybdenum layer GL2a, a second Mo—Ta alloy layer between the second tantalum layer GL1b and the first molybdenum layer GL2a, and a third Mo—Ta alloy layer between the second tantalum layer GL1b and the second molybdenum layer GL2b. In some example embodiments, the first tantalum layer GL1a and the first molybdenum layer GL2a may be partially mixed. In some example embodiments, the first molybdenum layer GL2a and the second tantalum layer GL1b may be partially mixed. In some example embodiments, the second tantalum layer GL1b and the second molybdenum layer GL2b may be partially mixed.

A thickness T1a of the first tantalum layer GL1a and a thickness T1b of the second tantalum layer GL1b may be about 0.01 nm to about 5 nm, and may or may not be the same as each other. For example, in some example embodiments, the thickness T1a of the first tantalum layer GL1a may be greater than the thickness T1b of the second tantalum layer GL1b. Ta of the first tantalum layer GL1a may induce a positive fixed charge of the gate dielectric layer GD through an interface reaction with the gate dielectric layer GD, and thus, an effective work function of the first gate layer G1a may be reduced. When the first tantalum layer GL1a directly contacts the gate dielectric layer GD, a probability that the interface reaction occurs may increase.

Figure 7:
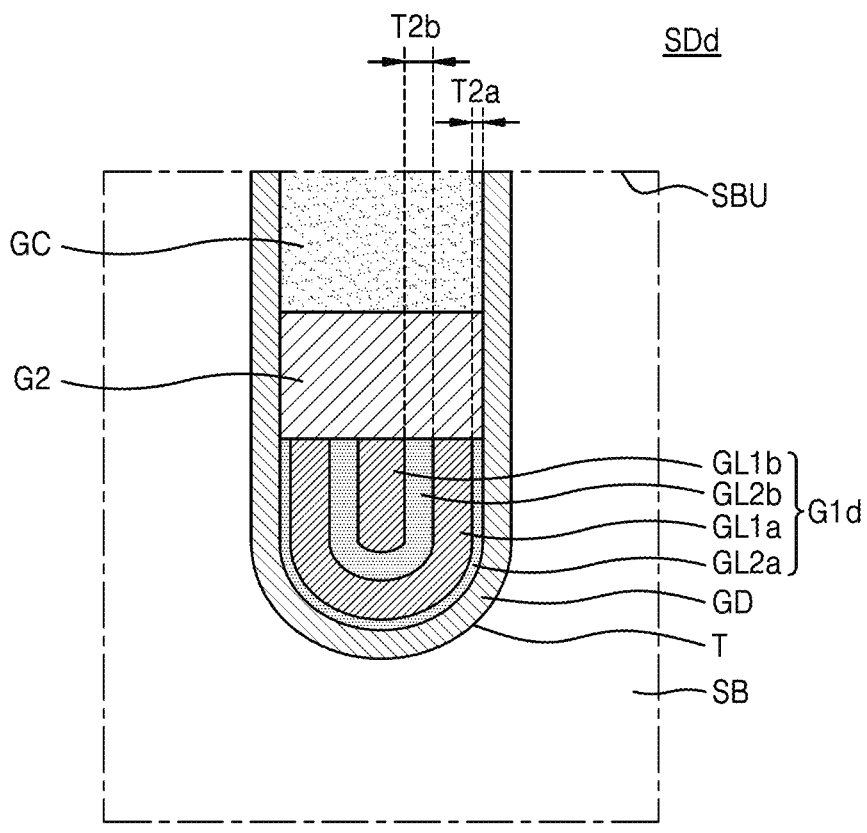
FIG. 7 is a cross-sectional view of a semiconductor device according to some example embodiments.

FIG. 7 is a cross-sectional view of a semiconductor device SDd according to some example embodiments. Hereinafter, a difference between the semiconductor device SD illustrated in FIG. 1 and the semiconductor device SDd illustrated in FIG. 7 will be described.

Referring to FIG. 7, the semiconductor device SDd may include a substrate SB, a gate dielectric layer GD on a trench T of the substrate SB, and a first gate layer G1d on the gate dielectric layer GD. In some example embodiments, the semiconductor device SDd may further include a second gate layer G2 on the first gate layer G1d. The semiconductor device SDd may further include a gate capping layer GC on the second gate layer G2. Detailed descriptions of the substrate SB, the gate dielectric layer GD, the second gate layer G2, and the gate capping layer GC are the same as the descriptions of FIG. 1.

The first gate layer G1d may include a plurality of molybdenum layers and a plurality of tantalum layers, which are alternately arranged on the gate dielectric layer GD one by one. For example, the first gate layer G1d may have a Mo—Ta multilayer structure. For example, the first gate layer G1d may include a first molybdenum layer GL2a on the gate dielectric layer GD, a first tantalum layer GL1a on the first molybdenum layer GL2a, a second molybdenum layer GL2b on the first tantalum layer GL1a, and a second tantalum layer GL1b on the second molybdenum layer GL2b. In FIG. 7, the first gate layer G1d is illustrated as including two tantalum layers and two molybdenum layers, but the number of tantalum layers and the number of molybdenum layers included in the first gate layer G1d are not limited to 2 and may be variously changed.

In some example embodiments, an upper end of the first tantalum layer GL1a, an upper end of the first molybdenum layer GL2a, an upper end of the second tantalum layer GL1b, and an upper end of the second molybdenum layer GL2b may be disposed at the same level. The second gate layer G2 may be disposed on the first tantalum layer GL1a, the first molybdenum layer GL2a, the second tantalum layer GL1b, and the second molybdenum layer GL2b.

In some example embodiments, although not shown in FIG. 7, the first gate layer G1d may further include at least one of a first Mo—Ta alloy layer between the first molybdenum layer GL2a and the first tantalum layer GL1a, a second Mo—Ta alloy layer between the first tantalum layer GL1a and the second molybdenum layer GL2b, and a third Mo—Ta alloy layer between the second molybdenum layer GL2b and the second tantalum layer GL1b. In some example embodiments, the first molybdenum layer GL2a and the first tantalum layer GL1a may be partially mixed or partially homogenized. In some example embodiments, the first tantalum layer GL1a and the second molybdenum layer GL2b may be partially mixed. In some example embodiments, the second molybdenum layer GL2b and the second tantalum layer GL1b may be partially mixed.

A thickness T2a of the first molybdenum layer GL2a and a thickness T2b of the second molybdenum layer GL2b may be about 0.01 nm to about 5 nm. In some example embodiments, the thickness T2a of the first molybdenum layer GL2a may be less than the thickness T2b of the second molybdenum layer GL2b.

Figure 8A:
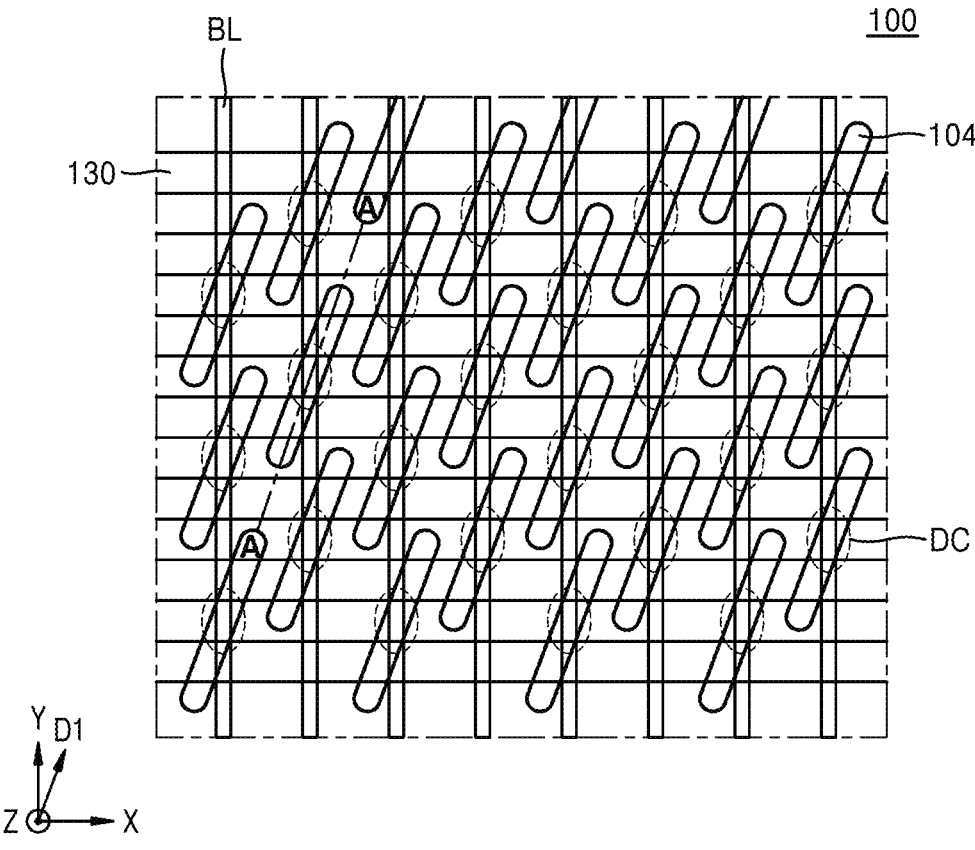
FIG. 8A is a plan view of a semiconductor device according to some example embodiments.
Figure 8B:
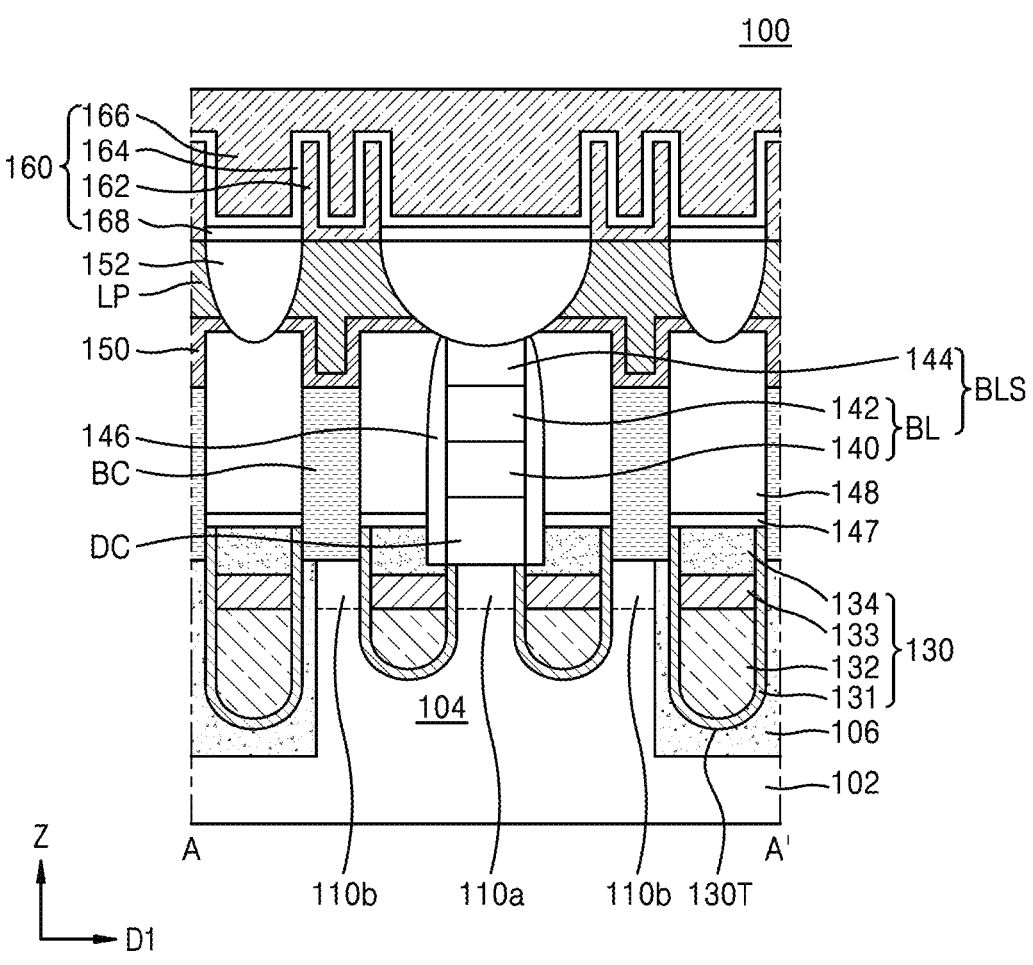
FIG. 8B is a cross-sectional view, taken along line A-A' of FIG. 8, of a semiconductor device according to some example embodiments.

FIG. 8A is a plan view of a semiconductor device 100 according to some example embodiments. FIG. 8B is a cross-sectional view, taken along line A-A' of FIG. 8, of the semiconductor device 100 according to some example embodiments.

Referring to FIGS. 8A and 8B, the semiconductor device 100 may include a substrate 102. The substrate 102 may correspond to the substrate SB illustrated in FIGS. 1 and 4 to 7. An active region 104 of the substrate 102 may be defined by or surrounded by an isolation layer 106. The active region 104 may have an elongated island shape in a D1 direction. The isolation layer 106 may include silicon oxide, silicon nitride, or a combination thereof.

The active region 104 may include a first impurity region 110a and two second impurity regions 110b. The first impurity region 110a may be disposed at a center of the active region 104, and the two second impurity regions 110b may be respectively disposed at both ends of the active region 104. The first impurity region 110a and the two second impurity regions 110b may be formed by doping, e.g. implanting, impurities on an upper portion of the active region 104. In some example embodiments, the first impurity region 110a may be a source region, and the second impurity regions 110b may be a drain region. The impurities may include N-type impurities such as but not limited to at least one of arsenic or phosphorus; however, example embodiments are not limited thereto. For example, the impurities may alternatively or additionally include P-type impurities such as boron, and/or other impurities such as carbon and/or silicon and/or germanium.

A gate structure 130 may be referred to as a word line or a row. A plurality of gate structures 130, as illustrated in FIG. 8, may extend in parallel in a first horizontal direction (an X direction). The plurality of gate structures 130 may be apart from one another in a second horizontal direction (a Y direction). Two gate structures 130 may intersect with one active region 104. The gate structure 130 may intersect with the active region 104 and the isolation layer 106. In some example embodiments, a lower end of a portion of the gate structure 130 intersecting with the active region 104 may be disposed at a level which is higher than a lower end of a portion of the gate structure 130 intersecting with the isolation layer 106. In some example embodiments, an upper end of a portion of the gate structure 130 intersecting with the active region 104 and an upper end of a portion of the gate structure 130 intersecting with the isolation layer 106 may be disposed at the same level.

The gate structure 130 may include a gate dielectric layer 131 on or in or conformal with a gate trench 130T, a first gate layer 132 on the gate dielectric layer 131, a second gate layer 133 on the first gate layer 132, and a gate capping layer 134 on the second gate layer 133. The gate trench 130T illustrated in FIG. 8B may correspond to the trench T illustrated in FIGS. 1 and 4 to 7. The gate dielectric layer 131 illustrated in FIG. 8B may correspond to the gate dielectric layer GD illustrated in FIGS. 1 and 4 to 7. The first gate layer 132 illustrated in FIG. 8B may correspond to the first gate layer G1 illustrated in FIG. 1, the first gate layer G1a illustrated in FIG. 4, the first gate layer G1b illustrated in FIG. 5, the first gate layer G1c illustrated in FIG. 6, or the first gate layer G1d illustrated in FIG. 7. The second gate layer 133 illustrated in FIG. 8B may correspond to the second gate layer G2 illustrated in FIGS. 1 and 4 to 7. The gate capping layer 134 illustrated in FIG. 8B may correspond to the gate capping layer GC illustrated in FIGS. 1 and 4 to 7.

A first insulation pattern 147 may be disposed on a top surface of the substrate 102 and may cover a top surface of the gate capping layer 134. The first insulation pattern 147 may include silicon oxide, silicon oxynitride, or a combination thereof. In some example embodiments, the first insulation pattern 147 may include a multilayer.

A bit line contact plug DC may pass through the first insulation pattern 147 and may be disposed in the first impurity region 110a. The bit line contact plug DC may be electrically connected to the first impurity region 110a. A lower portion of the bit line contact plug DC may be recessed into the substrate 102. The bit line contact plug DC may include metal, metal nitride, a semiconductor such as doped polysilicon, or a combination thereof. The metal may include, for example, tungsten (W), cobalt (Co), nickel (Ni), aluminum (Al), Mo, ruthenium (Ru), titanium (Ti), Ta, copper (Cu), or a combination thereof. The metal nitride may include, for example, tungsten nitride (WN), titanium nitride (TiN), tantalum nitride (TaN), or a combination thereof. The semiconductor may include, for example, Si and/or Ge. In some example embodiments, the bit line contact plug DC may include doped polysilicon.

A bit line structure BLS may include a bit line BL and a second insulation pattern 144, which are sequentially stacked on the bit line contact plug DC. As illustrated in FIG. 8A, bit lines BL may extend in parallel in the second horizontal direction (the Y direction). The bit lines BL may be apart from one another in the first horizontal direction (the X direction). The bit lines BL may correspond to columns. The bit line BL may include a first conductive pattern 140 and a second conductive pattern 142 on the first conductive pattern 140. The first conductive pattern 140 may include doped polysilicon, and the second conductive pattern 142 may include Ti, titanium nitride (TiN), titanium silicon nitride (TiSiN), W, tungsten nitride (WN), tungsten silicide (WSi), tungsten silicon nitride (WSiN), Ru, Al, Ni, Co, or a combination thereof. The second insulation pattern 144 may include silicon oxide, silicon nitride, or a combination thereof.

A bit line spacer 146 may be formed at a side surface of each of the bit line contact plug DC and the bit line structure BLS. In some example embodiments, the bit line spacer 146 may include a multi-layer film structure. The bit line spacer 146 may include silicon oxide, silicon nitride, or a combination thereof.

A storage node contact BC may contact the second impurity region 110b and may be electrically connected to the second impurity region 110b. The storage node contact BC may pass through the first insulation pattern 147. A lower portion of the storage node contact BC may be recessed into the substrate 102. A top surface of the storage node contact BC may be disposed at a level which is higher than a top surface of the first insulation pattern 147. The storage node contact BC may include impurity-doped semiconductor material, metal, metal nitride, or a combination thereof.

A third insulation pattern 148 may be disposed on the first insulation pattern 147 and may be disposed between adjacent storage node contacts BC. The third insulation pattern 148 may electrically insulate a plurality of storage contact nodes BC. A top surface of the third insulation pattern 148 may be disposed at a level which is higher than a top surface of the storage node contact BC. The third insulation pattern 148 may include, for example, $SiO_2$, SiBCN, SiCN, SiOCN, SiN, or a combination thereof.

A barrier pattern 150 may be disposed on the storage node contact BC and the third insulation pattern 148. A landing pad LP may be disposed on the barrier pattern 150. Although not shown, a metal silicide layer may be disposed between the barrier pattern 150 and the storage node contact BC. The metal silicide layer may include, for example, nickel silicide, manganese silicide, or a combination thereof. The barrier pattern 150 may protect or at least partially protect the storage node contact BC in performing a process of forming the landing pad LP. The barrier pattern 150 may include TiN, Ti, TiSiN, TaN, WN, or a combination thereof. The landing pad LP may include metal, metal silicide, metal nitride, doped polysilicon, or a combination thereof. For example, the landing pad LP may include W.

A fourth insulation pattern 152 may be disposed between adjacent landing pads LP. A lower end of the fourth insulation pattern 152 may pass through the barrier pattern 150 and may contact the third insulation pattern 148. An upper end of the fourth insulation pattern 152 may be disposed at the same level as an upper end of the landing pad LP. The fourth insulation pattern 152 may insulate a plurality of landing pads LP. The fourth insulation pattern 152 may include silicon oxide, silicon nitride, or a combination thereof.

A capacitor 160 and/or a hysteresis element may be disposed on the landing pad LP. The capacitor 160 may include a lower electrode 162, a capacitor dielectric layer 164 on the lower electrode 162, and an upper electrode 166 on the capacitor dielectric layer 164. The capacitor 160 may further include an etch stop layer 168 on the fourth insulation pattern 152.

As illustrated in FIG. 8B, a lower electrode 162 may have a cylinder shape. In some example embodiments, unlike the illustration of FIG. 8B, the lower electrode 162 may have a pillar shape or a prismatic shape. The lower electrode 162 may be electrically connected to the landing pad LP. The lower electrode 162 may include metal, metal nitride, or a combination thereof. The metal may include, for example, Ti, W, or a combination thereof. The metal nitride may include, for example, TiN, WN, or a combination thereof.

The capacitor dielectric layer 164 may be conformally formed on the lower electrode 162 and the etch stop layer 168. The capacitor dielectric layer 164 may include a high-k material. The high-k material may include, for example, $Al_2O_3$, $HfO_2$, $Y_2O_3$, $ZrO_2$, $TiO_2$, or a combination thereof. The material may have a dielectric constant greater than that of $SiO_2$.

The upper electrode 166 may be disposed on the capacitor dielectric layer 164. The upper electrode 166 may include metal, metal nitride, or a combination thereof. The metal may include Ti, W, Ta, Ru, or a combination thereof. The metal nitride may include WN, TiN, TaN, or a combination thereof.

The etch stop layer 168 may be disposed on the fourth insulation pattern 152. The etch stop layer 168 may include silicon nitride or silicon oxynitride.

FIGS. 9A to 9F are cross-sectional views illustrating a method of manufacturing or fabricating a semiconductor device, according to some example embodiments.

Figure 9A:
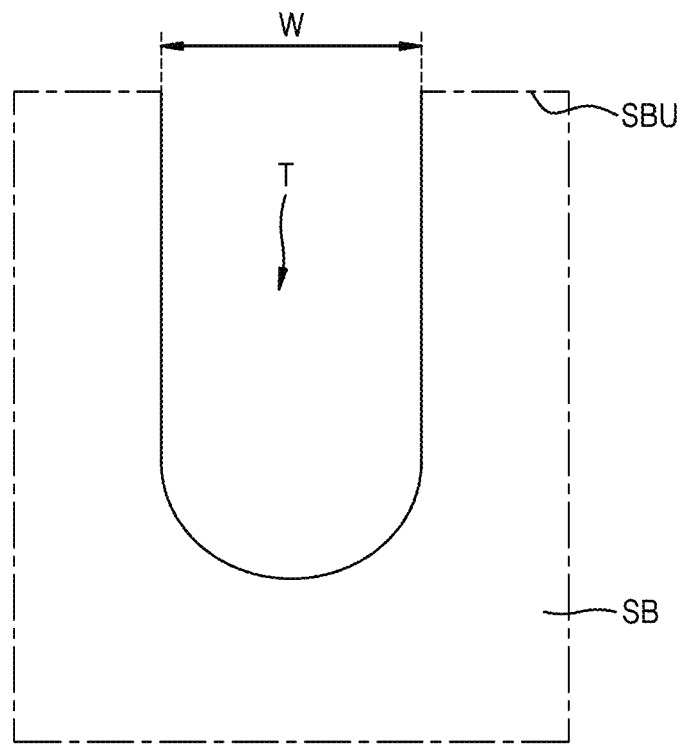
FIGS. 9A to 9F are cross-sectional views illustrating a method of manufacturing a semiconductor device, according to some example embodiments.

Referring to FIG. 9A, by partially etching a substrate SB e.g. with an anisotropic etch such as a dry etching process, a trench T may be formed in the substrate SB. A width W of the trench T may be about 2 nm to about 20 nm (for example, about 2 nm to about 15 nm or about 2 nm to about 10 nm). For example, a mask pattern may be formed on the substrate SB, and a portion of the substrate SB exposed by the mask pattern may be etched.

Figure 9B:
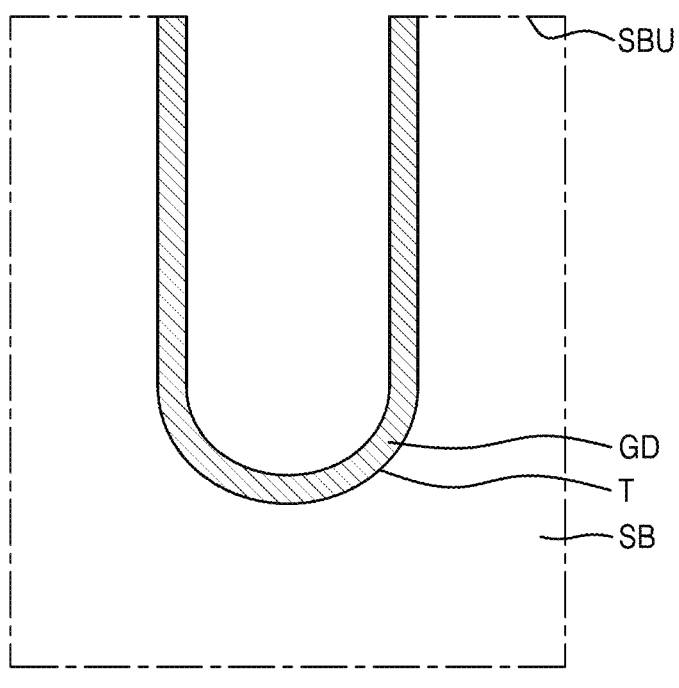

Referring to FIG. 9B, a gate dielectric layer GD may be formed on or in a trench T of the substrate SB. The gate dielectric layer GD may be formed by an oxidation process and/or an atomic layer deposition (ALD) process. The gate dielectric layer GD may be formed, for example, with a thermal oxidation process including an in-situ steam generation (ISSG) process; however, example embodiments are not limited thereto. The gate dielectric layer GD may be formed conformally within the trench T and also on an upper surface of the substrate SB, and portions of the gate dielectric layer GD on the upper surface of the substrate SB may be removed for example with an etching process and/or a chemical mechanical planarization (CMP) process; however, example embodiments are not limited thereto. After the gate dielectric layer GD is formed, annealing and/or plasma processing may be performed on the gate dielectric layer GD. The annealing may be performed at about 950° C. to about 1,050° C. The annealing or the plasma processing may use a gas including nitrogen, and for example, may use one or more of $N_2$, NO, or $NH_3$. The annealing and/or the plasma processing may form a positive fixed charge in the gate dielectric layer GD. If both the annealing process and the plasma process are performed, annealing process may be performed prior to or after the plasma process and may or may not be performed in the same process chamber; however, example embodiments are not limited thereto. The annealing process may be a rapid thermal annealing (RTA) process and/or a laser annealing (LA) process and/or a furnace annealing process; example embodiments are not limited thereto.

Figure 9C:
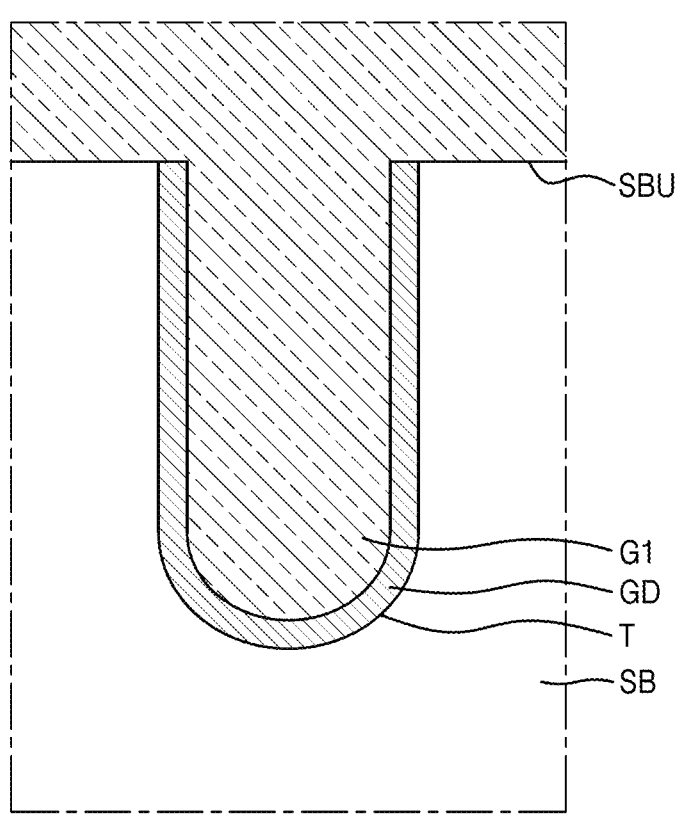

Referring to FIG. 9C, a first gate layer G1 may be formed on the gate dielectric layer GD. The first gate layer G1 may be formed by an ALD process. The first gate layer G1 may further cover a top surface SBU of the substrate SB. The first gate layer G1 may include a Mo—Ta alloy.

After the first gate layer G1 is formed and for example prior to any further formation of the second gate layer G2 or removal of the first layer G1 from an upper surface of the substrate SB, the first gate layer G1 and the gate dielectric layer GD may be annealed. An annealing temperature may be about 600° C. to about 900° C. or about 900° C. to about 1200° C. In some example embodiments, the annealing may grow grains of a Mo—Ta alloy. In some example embodiments, the annealing may change a crystalline direction of a Mo—Ta alloy. After annealing, an electron mean free path of the first gate layer G1 may be less than a width W (see FIG. 9A) of the trench T. Therefore, the amount of an increase in resistance of the first gate layer G1 caused by a reduction in width W (see FIG. 9A) of the trench T may be reduced. After annealing, a Ta concentration of the first gate layer G1 may be about 5 at % to about 50 at %. After annealing, a resistivity of the first gate layer G1 may be about 30 $\mu\Omega\cdot$cm or less. After annealing, a figure of merit of the first gate layer G1 may be about $2\times10^{-16}$ $\Omega\cdot$m$^2$ or less. After annealing, a work function of the first gate layer G1 may be about 4.5 eV or less. A Mo—Ta alloy may have a relatively small work function and a relatively small figure of merit, and thus, may be used as a material of the first gate layer G1. In some example embodiments, Ta of a Mo—Ta alloy may induce a positive fixed charge of the gate dielectric layer GD through an interface reaction with the gate dielectric layer GD in annealing. Therefore, an effective work function of the first gate layer G1 may be more reduced.

Figure 9D:
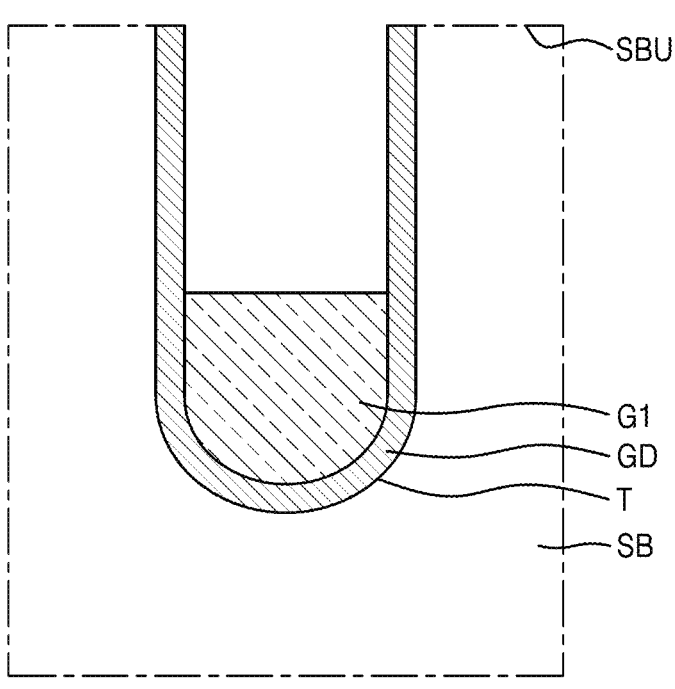

Referring to FIG. 9D, an upper portion of the first gate layer G1 may be removed so that an upper end of the first gate layer G1 is disposed at a level which is lower than the top surface SBU of the substrate SB. For example, an etch back process, alone or in conjunction with a CMP process, may be performed.

After the etch back process, annealing and/or plasma processing may be performed on the first gate layer G1 and the gate dielectric layer GD. The annealing may be performed at about 950° C. to about 1,050° C. The annealing and/or the plasma processing may use a gas including nitrogen, and for example, may use N$_2$, NO, or NH$_3$. In some example embodiments, the annealing or the plasma processing may form a positive fixed charge in the gate dielectric layer GD. In some example embodiments, the annealing and/or the plasma processing may repair damage caused by the etch back process. In some example embodiments, the annealing and/or the plasma processing may be performed within a decoupled plasma nitride (DPN) chamber; however, example embodiments are not limited thereto.

Figure 9E:
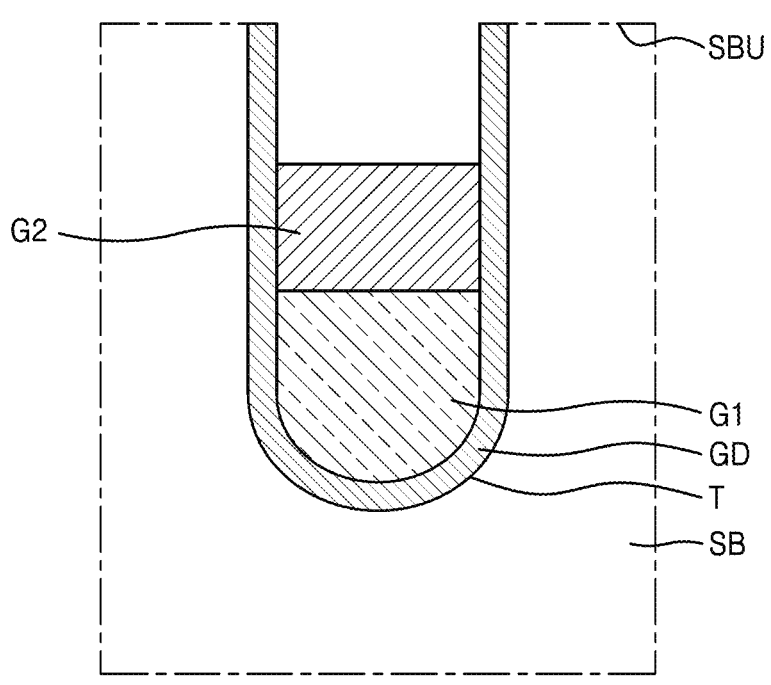

Referring to FIG. 9E, a second gate layer G2 may be formed on the first gate layer G1, the gate dielectric layer GD, and the substrate SB. After the second gate layer G2 is formed, an upper portion of the second gate layer G2 may be removed so that an upper end of the second gate layer G2 is disposed at a level which is lower than the top surface SBU of the substrate SB. For example, an etch back process alone or in conjunction with a CMP process may be performed.

After the etch back process, annealing and/or plasma processing may be performed on the gate dielectric layer GD, the first gate layer G1, and the second gate layer G2. The annealing may be performed at about 950° C. to about 1,050° C. The annealing or the plasma processing may use a gas including nitrogen, and for example, may use N$_2$, NO, or NH$_3$. In some example embodiments, the annealing or the plasma processing may form a positive fixed charge in the gate dielectric layer GD. In some example embodiments, the annealing and/or the plasma processing may repair damage caused by the etch back process. In some example embodiments, the annealing and/or the plasma processing may be performed within a decoupled plasma nitride (DPN) chamber; however, example embodiments are not limited thereto.

Figure 9F:
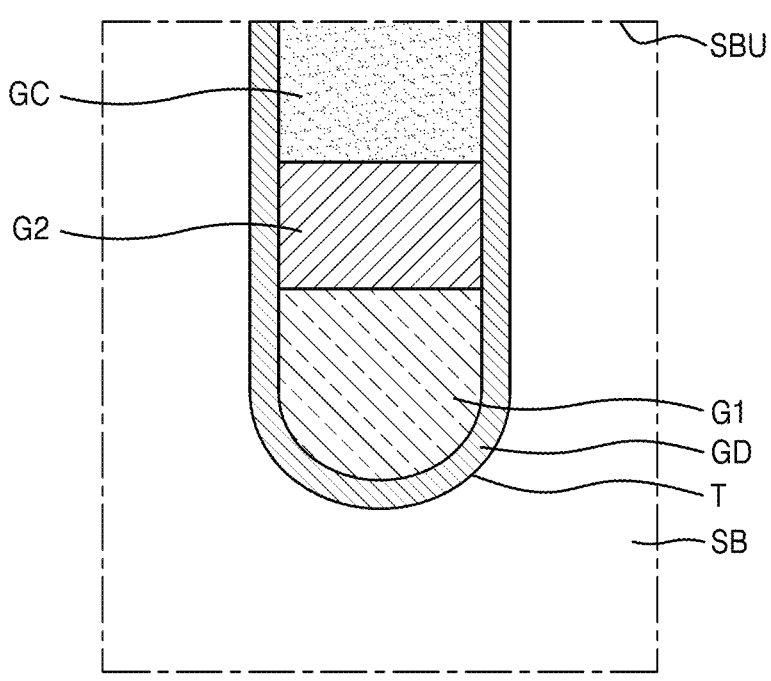

Referring to FIG. 9F, a gate capping layer GC may be formed on the second gate layer G2, the gate dielectric layer GD, and the substrate SB. The gate capping layer GC may be polished to expose the top surface SBU of the substrate SB. For example, a chemical mechanical polish (CMP) process may be performed. In some example embodiments, a top surface of the gate capping layer GC may be coplanar with the top surface SBU of the substrate SB. The semiconductor device SD illustrated in FIG. 1 may be manufactured by the manufacturing method described above with reference to FIGS. 9A to 9F.

Figure 10:
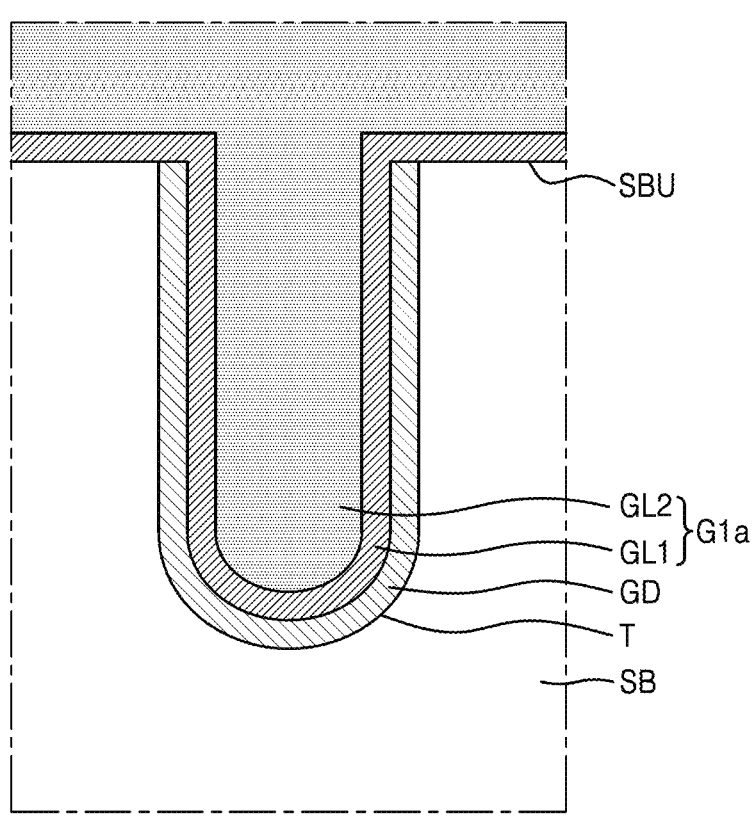
FIG. 10 is a cross-sectional view illustrating a method of manufacturing a semiconductor device, according to some example embodiments.

FIG. 10 is a cross-sectional view illustrating a method of manufacturing a semiconductor device, according to some example embodiments.

Referring to FIG. 10, by partially etching a substrate SB, a trench T may be formed in a substrate SB. Subsequently, a gate dielectric layer GD may be formed on or within the trench T of the substrate SB. After the gate dielectric layer GD is formed, annealing and/or plasma processing may be performed on the gate dielectric layer GD.

Subsequently, a first gate layer G1a may be formed on the gate dielectric layer GD. For example, a tantalum layer GL1 may be formed on the gate dielectric layer GD and the substrate SB, and a molybdenum layer GL2 may be formed on the tantalum layer GL1. After the first gate layer G1a is formed, the first gate layer G1a and the gate dielectric layer GD may be annealed.

In some example embodiments, an annealing temperature may be relatively low for preventing or reducing the likelihood of and/or impact from the tantalum layer GL1 and the molybdenum layer GL2 from being completely mixed. For example, the annealing temperature may be, for example, about 600° C. to about 900° C. The tantalum layer GL1 may induce a positive fixed charge of the gate dielectric layer GD through an interface reaction with the gate dielectric layer GD in annealing. Therefore, an effective work function of the first gate layer G1a may be more reduced.

In some example embodiments, because the tantalum layer GL1 and the molybdenum layer GL2 are completely mixed, as illustrated in FIG. 9C, an annealing temperature may be relatively high to form the first gate layer G1 including a Mo—Ta alloy. For example, the annealing temperature may be, for example, about 900° C. to about 1200° C. In some example embodiments, Ta of a Mo—Ta alloy may induce a positive fixed charge of the gate dielectric layer GD through an interface reaction with the gate dielectric layer GD in annealing. Therefore, an effective work function of the first gate layer G1 may be more reduced.

In a case where the first gate layer G1 including a Mo—Ta alloy is formed as illustrated in FIG. 9C, operations described above with reference to FIGS. 9D to 9F may be further performed, and thus, the semiconductor device SD illustrated in FIG. 1 may be manufactured.

In a case where at least a portion of the tantalum layer GL1 and at least a portion of the molybdenum layer GL2 are maintained after annealing, operations described above with reference to FIGS. 9D to 9F may be further performed, and thus, the semiconductor device SDa illustrated in FIG. 4 may be manufactured.

Figure 11:
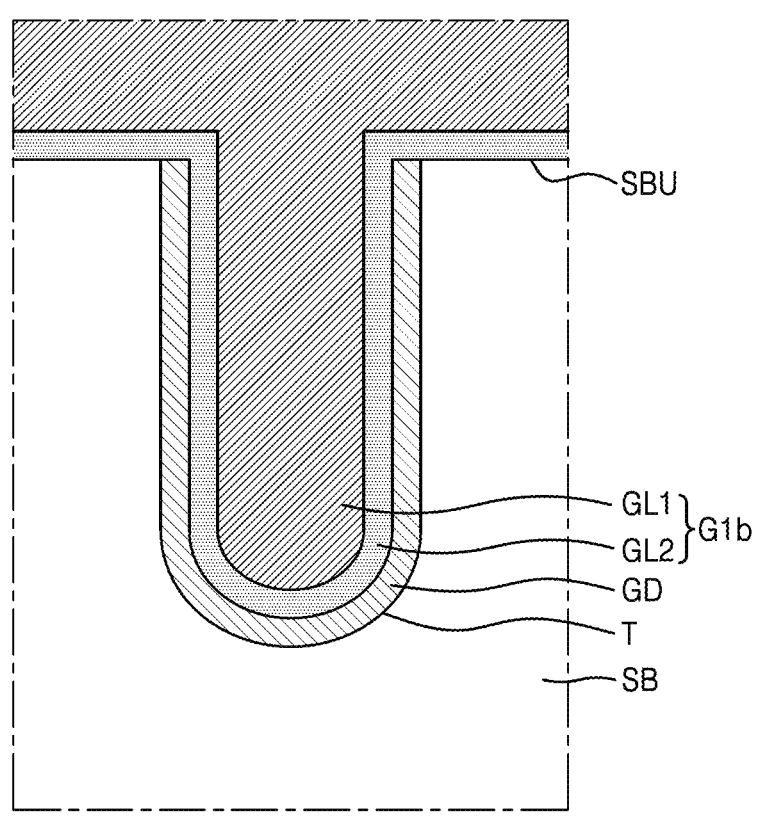
FIG. 11 is a cross-sectional view illustrating a method of manufacturing a semiconductor device, according to some example embodiments.

FIG. 11 is a cross-sectional view illustrating a method of manufacturing a semiconductor device, according to some example embodiments.

Referring to FIG. 11, by partially etching a substrate SB, a trench T may be formed in a substrate SB. Subsequently, a gate dielectric layer GD may be formed on or in the trench T of the substrate SB. After the gate dielectric layer GD is formed, annealing and/or plasma processing may be performed on the gate dielectric layer GD.

Subsequently, a first gate layer G1*b* may be formed on the gate dielectric layer GD. For example, a molybdenum layer GL2 may be formed on the gate dielectric layer GD and the substrate SB, and a tantalum layer GL1 may be formed on the molybdenum layer GL2. After the first gate layer G1*b* is formed, the first gate layer G1*b* and the gate dielectric layer GD may be annealed.

In some example embodiments, an annealing temperature may be relatively low for preventing or reducing the probability of and/or impact from the tantalum layer GL1 and the molybdenum layer GL2 from being completely mixed. For example, the annealing temperature may be, for example, about 600° C. to about 900° C. In annealing, the molybdenum layer GL2 may prevent or decrease the probability of and/or impact from a trap which is formed in the gate dielectric layer GD.

In some example embodiments, because the tantalum layer GL1 and the molybdenum layer GL2 are completely mixed, as illustrated in FIG. 9C, an annealing temperature may be relatively high to form the first gate layer G1 including a Mo—Ta alloy. For example, the annealing temperature may be, for example, about 900° C. to about 1200° C. In some example embodiments, Ta of a Mo—Ta alloy may induce a positive fixed charge of the gate dielectric layer GD through an interface reaction with the gate dielectric layer GD in annealing. Therefore, an effective work function of the first gate layer G1 may be more reduced.

In a case where the first gate layer G1 including a Mo—Ta alloy is formed as illustrated in FIG. 9C, operations described above with reference to FIGS. 9D to 9F may be further performed, and thus, the semiconductor device SD illustrated in FIG. 1 may be manufactured.

In a case where at least a portion of the tantalum layer GL1 and at least a portion of the molybdenum layer GL2 are maintained after annealing, operations described above with reference to FIGS. 9D to 9F may be further performed, and thus, the semiconductor device SDb illustrated in FIG. 5 may be manufactured.

Figure 12:
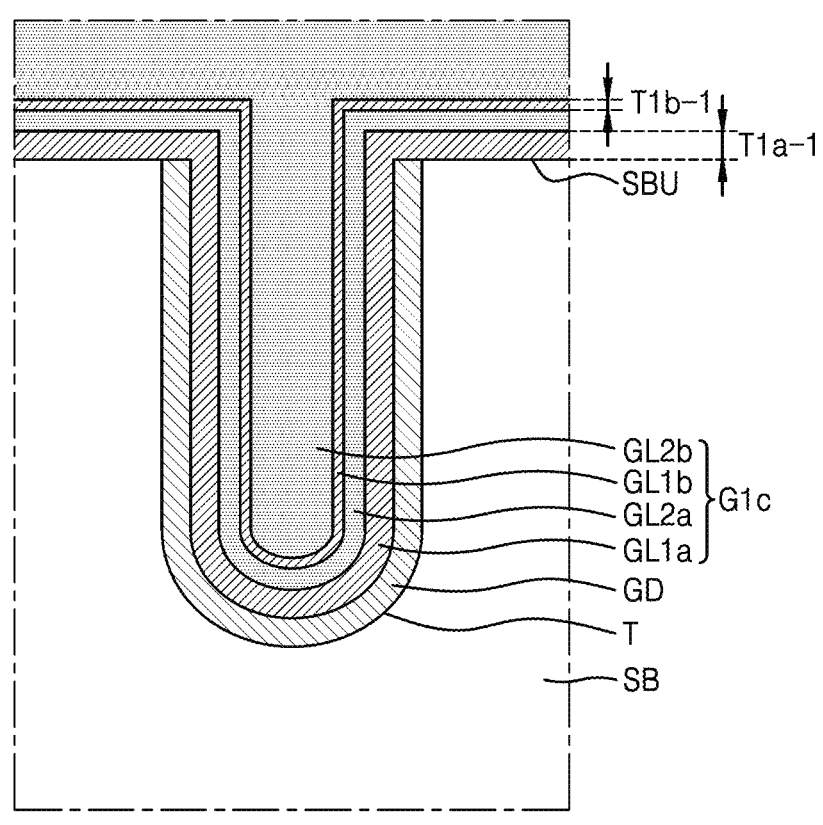
FIG. 12 is a cross-sectional view illustrating a method of manufacturing a semiconductor device, according to some example embodiments.

FIG. 12 is a cross-sectional view illustrating a method of manufacturing a semiconductor device, according to some example embodiments.

Referring to FIG. 12, by partially etching a substrate SB, a trench T may be formed in a substrate SB. Subsequently, a gate dielectric layer GD may be formed on the trench T of the substrate SB. After the gate dielectric layer GD is formed, annealing or plasma processing may be performed on the gate dielectric layer GD.

Subsequently, a first gate layer G1*c* may be formed on the gate dielectric layer GD. For example, a tantalum layer GL1*a* may be formed on the gate dielectric layer GD and the substrate SB, and a molybdenum layer GL2*a* may be formed on the tantalum layer GL1*a*. The second tantalum layer GL1*b* may be formed on the first molybdenum GL2*a*, and the second molybdenum layer GL2*b* may be formed on the second tantalum layer GL1*b*. In some example embodiments, a thickness T1*a*-1 of the first tantalum layer GL1*a* may be greater than a thickness T1*b*-1 of the second tantalum layer GL1*b*. After the first gate layer G1*c* is formed, the first gate layer G1*c* and the gate dielectric layer GD may be annealed.

In some example embodiments, an annealing temperature may be relatively low for preventing the complete combination of the first and second tantalum layers GL1*a* and GL1*b* and the first and second molybdenum layers GL2*a* and GL2*b*. For example, the annealing temperature may be, for example, about 600° C. to about 900° C. The first tantalum layer GL1*a* may induce a positive fixed charge of the gate dielectric layer GD through an interface reaction with the gate dielectric layer GD in annealing. Therefore, an effective work function of the first gate layer G1*c* may be reduced.

In some example embodiments, because the first and second tantalum layers GL1*a* and GL1*b* and the first and second molybdenum layers GL2*a* and GL2*b* are completely mixed, as illustrated in FIG. 9C, an annealing temperature may be relatively high to form the first gate layer G1 including a Mo—Ta alloy. For example, the annealing temperature may be, for example, about 900° C. to about 1200° C. In some example embodiments, Ta of a Mo—Ta alloy may induce a positive fixed charge of the gate dielectric layer GD through an interface reaction with the gate dielectric layer GD in annealing. Therefore, an effective work function of the first gate layer G1 may be more reduced.

In some example embodiments, because the thickness T1*a*-1 of the first tantalum layer GL1*a* is greater than the thickness T1*b*-1 of the second tantalum layer GL1*b* before annealing, a Ta concentration of the first gate layer G1 may be highest near the gate dielectric layer GD. Accordingly, a reaction between Ta and the gate dielectric layer GD may be facilitated.

In a case where the first gate layer G1 including a Mo—Ta alloy is formed as illustrated in FIG. 9C, operations described above with reference to FIGS. 9D to 9F may be further performed, and thus, the semiconductor device SD illustrated in FIG. 1 may be manufactured.

In a case where at least a portion of the first tantalum layer GL1*a*, at least a portion of the second tantalum layer GL1*b*, at least a portion of the first molybdenum layer GL2*a*, and at least a portion of the second molybdenum layer GL2*b* are maintained after annealing, operations described above with reference to FIGS. 9D to 9F may be further performed, and thus, the semiconductor device SDc illustrated in FIG. 6 may be manufactured.

Figure 13:
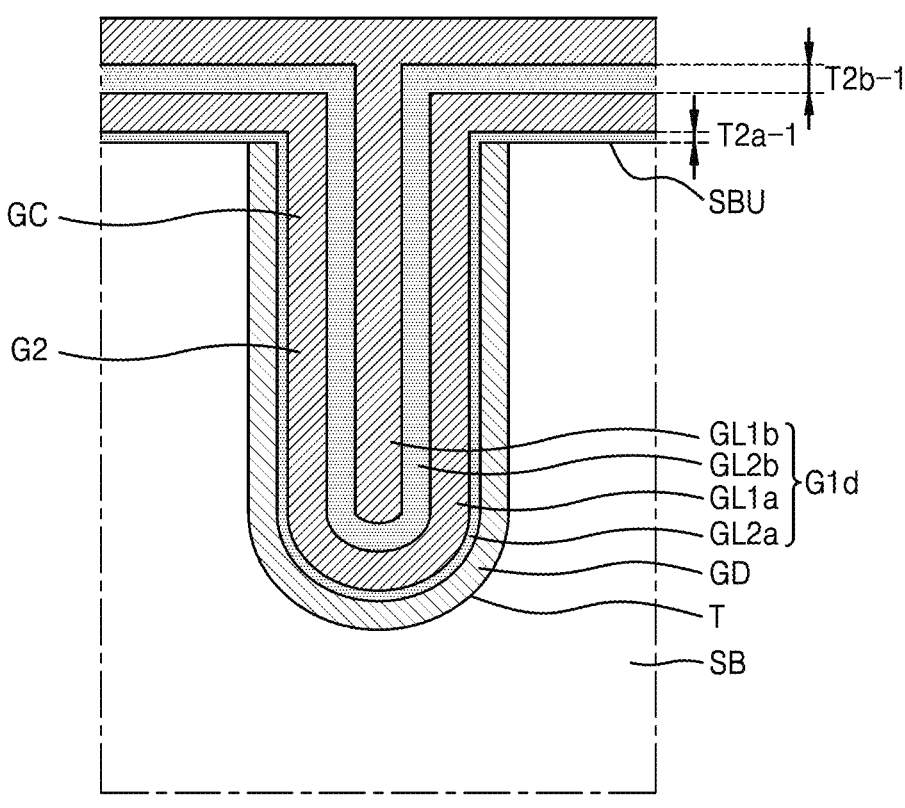
FIG. 13 is a cross-sectional view illustrating a method of manufacturing a semiconductor device, according to some example embodiments.

FIG. 13 is a cross-sectional view illustrating a method of manufacturing a semiconductor device, according to some example embodiments.

Referring to FIG. 13, by partially etching a substrate SB, a trench T may be formed in a substrate SB. Subsequently, a gate dielectric layer GD may be formed on the trench T of the substrate SB. After the gate dielectric layer GD is formed, annealing or plasma processing may be performed on the gate dielectric layer GD.

Subsequently, a first gate layer G1*d* may be formed on the gate dielectric layer GD. For example, a first molybdenum layer GL2*a* may be formed on the gate dielectric layer GD and the substrate SB, and a first tantalum layer GL1*a* may be formed on the first molybdenum layer GL2*a*. A second molybdenum layer GL2*b* may be formed on the first tantalum layer GL1*a*, and a second tantalum layer GL1*b* may be formed on the second molybdenum layer GL2*b*. In some example embodiments, a thickness T2*a*-1 of the first molybdenum layer GL2*a* may be less than a thickness T2*b*-1 of the second molybdenum layer GL2b. After the first gate layer G1d is formed, the first gate layer G1d and the gate dielectric layer GD may be annealed.

In some example embodiments, an annealing temperature may be relatively low for preventing the complete combination of the first and second tantalum layers GL1a and GL1b and the first and second molybdenum layers GL2a and GL2b. For example, the annealing temperature may be, for example, about 600° C. to about 900° C. In annealing, the first molybdenum layer GL2a may prevent or decrease a trap which is formed in the gate dielectric layer GD.

In some example embodiments, because the first and second tantalum layers GL1a and GL1b and the first and second molybdenum layers GL2a and GL2b are completely mixed, as illustrated in FIG. 9C, an annealing temperature may be relatively high to form the first gate layer G1 including a Mo—Ta alloy. For example, the annealing temperature may be, for example, about 900° C. to about 1200° C. In some example embodiments, Ta of a Mo—Ta alloy may induce a positive fixed charge of the gate dielectric layer GD through an interface reaction with the gate dielectric layer GD in annealing. Therefore, an effective work function of the first gate layer G1 may be more reduced.

In some example embodiments, because the thickness T2a-1 of the first tantalum layer GL2a is greater than the thickness T2b-1 of the second tantalum layer GL2b before annealing, a Ta concentration of the first gate layer G1 may be highest near the gate dielectric layer GD. Accordingly, a reaction between Ta and the gate dielectric layer GD may be facilitated.

In a case where the first gate layer G1 including a Mo—Ta alloy is formed as illustrated in FIG. 9C, operations described above with reference to FIGS. 9D to 9F may be further performed, and thus, the semiconductor device SD illustrated in FIG. 1 may be manufactured.

In a case where at least a portion of the first tantalum layer GL1a, at least a portion of the second tantalum layer GL1b, at least a portion of the first molybdenum layer GL2a, and at least a portion of the second molybdenum layer GL2b are maintained after annealing, operations described above with reference to FIGS. 9D to 9F may be further performed, and thus, the semiconductor device SDd illustrated in FIG. 7 may be manufactured.

Various example embodiments are not for limiting but is for describing inventive concepts, and the scope of inventive concepts is not limited by the embodiments. The scope of inventive concepts has to be construed by the appended claims, and all spirits within an equivalent range have to be construed as being included in the scope of inventive concepts.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While inventive concepts has been particularly shown and described with reference to various example embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. A method of manufacturing a semiconductor device, the method comprising:
   forming a trench in a substrate;
   forming a gate dielectric layer on the trench;
   forming a gate layer on the gate dielectric layer;
   performing a first annealing, wherein performing the first annealing anneals the gate dielectric layer and the gate layer,
   wherein, after the first annealing, the gate layer comprises a molybdenum-tantalum alloy;
   removing an upper portion of the gate layer; and
   performing a second annealing, wherein performing the second annealing anneals a lower portion of each of the gate layer and the gate dielectric layer.

2. The method of claim 1, wherein, after performing the first annealing, a width of the trench is greater than an electron mean free path of the gate layer.

3. The method of claim 2, wherein the width of the trench is greater than or equal to 2 nm and less than or equal to 20 nm.

4. The method of claim 1, wherein, after performing the first annealing, a resistivity of the gate layer is 30 μΩ·cm (microohm-centimeter) or less.

5. The method of claim 1, wherein a tantalum concentration of the gate layer is greater than or equal to 5 at % and less than or equal to 50 at %.

6. The method of claim 1, wherein a figure of merit of the gate layer after the first annealing is $2\times10^{-16}$ $\Omega\cdot m^2$ or less, and
   the figure of merit of the gate layer is defined by multiplication of a resistivity of the gate layer and an electron mean free path of the gate layer.

7. The method of claim 1, wherein an effective work function of the gate layer after the first annealing is 4.5 eV or less.

8. The method of claim 1, wherein the first annealing is performed at a temperature of greater than or equal to 900° C. and less than or equal to 1200° C.

9. The method of claim 1, wherein a positive fixed charge is formed in the gate dielectric layer by the second annealing.

10. The method of claim 1, wherein a gas including nitrogen is used in the second annealing.

11. The method of claim 1, wherein the forming the gate layer comprises:

forming a tantalum layer on the gate dielectric layer; and forming a molybdenum layer on the tantalum layer.

12. The method of claim 1, wherein the forming the gate layer comprises:

forming a molybdenum layer on the gate dielectric layer; and forming a tantalum layer on the molybdenum layer.

13. The method of claim 1, wherein the forming the gate layer comprises forming a molybdenum-tantalum alloy layer on the gate dielectric layer.

14. A method of manufacturing a semiconductor device, the method comprising:

forming a trench in a substrate;

forming a gate dielectric layer on the trench;

forming a gate layer on the gate dielectric layer;

annealing the gate dielectric layer and the gate layer;

removing an upper portion of the gate layer; and performing plasma repair processing on a lower portion of each of the gate layer and the gate dielectric layer to repair damage caused by removing the upper portion of the gate layer, wherein forming the gate layer comprises forming a first tantalum layer on the gate dielectric layer, and forming a first molybdenum layer on the first tantalum layer.

15. The method of claim 14, wherein the first tantalum layer and the first molybdenum layer are at least partially mixed in the annealing.

16. The method of claim 14, wherein the first tantalum layer reacts with the gate dielectric layer in the annealing.

17. The method of claim 14, wherein a positive fixed charge is formed in the gate dielectric layer in the annealing.

18. The method of claim 14, wherein the annealing is performed at a temperature, the temperature greater than or equal to 600° C. and less than or equal to 900° C., or greater than or equal to 900° C. and less than or equal to 1200° C.

19. A method of manufacturing a semiconductor device, the method comprising:

forming a trench in a substrate;

forming a gate dielectric layer on the trench;

forming a gate layer on the gate dielectric layer;

annealing the gate dielectric layer and the gate layer;

removing an upper portion of the gate layer; and performing plasma repair processing on a lower portion of each of the gate layer and the gate dielectric layer to repair damage caused by removing the upper portion of the gate layer, wherein the forming the gate layer further comprises forming a first molybdenum layer on the gate dielectric layer, and forming a first tantalum layer on the first molybdenum layer.

*    *    *    *    *